United States Patent
Buckley et al.

(10) Patent No.: US 8,205,143 B2
(45) Date of Patent: *Jun. 19, 2012

(54) MULTI-LAYER CYCLIC REDUNDANCY CHECK CODE IN WIRELESS COMMUNICATION SYSTEM

(75) Inventors: Michael E. Buckley, Grayslake, IL (US); Yufei W Blankenship, Kildeer, IL (US); Brian K Classon, Palatine, IL (US); Ajit Nimbalker, Arlington Heights, IL (US); Kenneth A Stewart, Grayslake, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/310,817

(22) Filed: Dec. 5, 2011

(65) Prior Publication Data

US 2012/0079359 A1    Mar. 29, 2012

Related U.S. Application Data

(63) Continuation of application No. 12/952,305, filed on Nov. 23, 2010, now Pat. No. 8,074,150, which is a continuation of application No. 11/855,637, filed on Sep. 14, 2007, now Pat. No. 7,853,857.

(51) Int. Cl.
*H03M 13/00* (2006.01)
(52) U.S. Cl. ......... 714/781; 714/758; 714/805; 714/755
(58) Field of Classification Search .................. 714/781, 714/758, 805, 755
See application file for complete search history.

(56) References Cited

U.S. PATENT DOCUMENTS

| 6,173,431 | B1 | 1/2001 | Rittle |
| 6,490,260 | B1 | 12/2002 | Hwang |
| 6,516,441 | B1 | 2/2003 | Kim et al. |
| 6,697,988 | B2 | 2/2004 | Kim et al. |
| 6,768,728 | B1 | 7/2004 | Kim et al. |
| 6,870,821 | B2 * | 3/2005 | Sebire .......................... 370/328 |
| 6,993,062 | B1 | 1/2006 | Kong et al. |
| 7,133,388 | B2 | 11/2006 | Belaiche |

(Continued)

FOREIGN PATENT DOCUMENTS

JP    2003-243993 A    8/2003

(Continued)

OTHER PUBLICATIONS

IEEE vol. 41 No. 6 Jun. 1993.

(Continued)

*Primary Examiner* — Esaw Abraham
(74) *Attorney, Agent, or Firm* — Roland K. Bowler, II

(57) ABSTRACT

A communication device is disclosed. The device is configured to generate a first block of first cyclic redundancy check (CRC) parity bits on a transport block wherein the first block of CRC parity bits is based on a first generator polynomial, to attach the first block of CRC parity bits to the transport block and to segment the transport block into multiple code blocks. The processor is also configured to generate a second block of CRC parity bits on each code block wherein each of the second blocks of CRC parity bits is based on a second generator polynomial that is different than the first generator polynomial. The first and second generator polynomials have a common degree. A second block of CRC parity bits is attached to each code block, and the code blocks are concatenated after channel encoding.

19 Claims, 3 Drawing Sheets

U.S. PATENT DOCUMENTS

| | | | | |
|---|---|---|---|---|
| 7,269,149 | B2 * | 9/2007 | Kukla et al. | 370/328 |
| 7,318,185 | B2 * | 1/2008 | Khandani et al. | 714/758 |
| 7,372,837 | B2 * | 5/2008 | Kinjo et al. | 370/338 |
| 7,392,460 | B2 * | 6/2008 | Kim et al. | 714/781 |
| 7,447,968 | B2 | 11/2008 | Ha et al. | |
| 7,460,607 | B2 * | 12/2008 | van Rooyen et al. | 375/265 |
| 7,461,324 | B2 | 12/2008 | Berkmann et al. | |
| 7,810,014 | B2 * | 10/2010 | Kim et al. | 714/758 |
| 2003/0123409 | A1 | 7/2003 | Kwak et al. | |
| 2004/0114484 | A1 | 6/2004 | Sako et al. | |
| 2004/0268206 | A1 | 12/2004 | Kim et al. | |
| 2005/0195769 | A1 | 9/2005 | Kaewell, Jr. et al. | |
| 2008/0192705 | A1 | 8/2008 | Suzuki | |

FOREIGN PATENT DOCUMENTS

| | | | |
|---|---|---|---|
| JP | 2006-180172 A | 7/2006 | |
| WO | 0002320 A1 | 1/2000 | |
| WO | 2006114855 A1 | 11/2006 | |

OTHER PUBLICATIONS

DRAFT3GPP TS 36 212 V8 0 0 Sep. 2007.

3GPP TS 25212 V6 4 0 Mar. 2005.

3GPP TSG RAN WG1 Meeting #49bis; Orlando, USA, Jun. 25-29, 2007; Summary of the E-mail Discussion on Channel Coding; R1-072927; XP-002492528.

3GPP TSG RAN WG1 Meeting #49bis; R1-073108, "Analysis of per code block CRC and per transport block CRC", Samsung; Orlando, USA, Jun. 2007; 3 pages.

Castro, Jonathan P.: "The UMTS Network and radio Access Technology: Air Interface Techniques for Future Mobile Systems", Copyright 2001, John Wiley & Sons Ltd. Print ISBN 0-471-81375-3 Online ISBN 0-470-84172-9, all pages.

3GPP TR 25.944 v4.1.0 (Jun. 2001) Release 4, p. 16.

Ericsson, et al., "Way forward for CRC attachment for turbo-coded transport changes", 3GPP TSG-RAN Working Group 1, Meeting #50, R1-073843, Aug. 20-24, 2007, 1 page.

* cited by examiner

US 8,205,143 B2

MULTI-LAYER CYCLIC REDUNDANCY CHECK CODE IN WIRELESS COMMUNICATION SYSTEM

CROSS-REFERENCE TO RELATED APPLICATIONS

The present application is a continuation of U.S. application Ser. No. 12/952,305, filed on 23 Nov. 2010, now U.S. Pat. No. 8,074,150, which is a continuation of U.S. application Ser. No. 11/855,637, filed on 14 Sep. 2007, now U.S. Pat. No. 7,853,857, the contents of which are incorporated herein by reference and from which benefits are claimed under 35 U.S.C. 120.

FIELD OF THE DISCLOSURE

The present disclosure relates generally to wireless communications, and more specifically to the coding of data using cyclic redundancy check (CRC) codes.

BACKGROUND

CRC coding is commonly used to detect errors in data transmitted in wireless communication systems. In the evolving 3GPP LTE specification, for example, it has been proposed that 24 CRC parity bits be generated based on the entire transport block (TB). The 24 CRC parity bits are then attached to the TB, after which the TB is segmented into multiple code blocks (CBs). In the LTE proposal, 24 CRC parity bits are also calculated based on each code block (CB) and the 24 CRC parity bits are then attached to the corresponding CB. In the LTE proposal, the same generator polynomial is used in the generation of the CRC parity bits based on the transport block and in the generation of the CRC parity bits based on the code blocks. The first transport CRC encoding helps the receiving device to detect residual errors. It has been suggested that the CRC encoding of the code blocks may be used by the receiving device to reduce the number of turbo decoding processes, or to reduce the number of turbo decoding iterations, or to reduce turbo decoder memory usage. The code blocks are then channel encoded, for example, with a turbo code, prior to transmission.

The various aspects, features and advantages of the disclosure will become more fully apparent to those having ordinary skill in the art upon careful consideration of the following Detailed Description thereof with the accompanying drawings described below. The drawings may have been simplified for clarity and are not necessarily drawn to scale.

DETAILED DESCRIPTION

Figure 1:
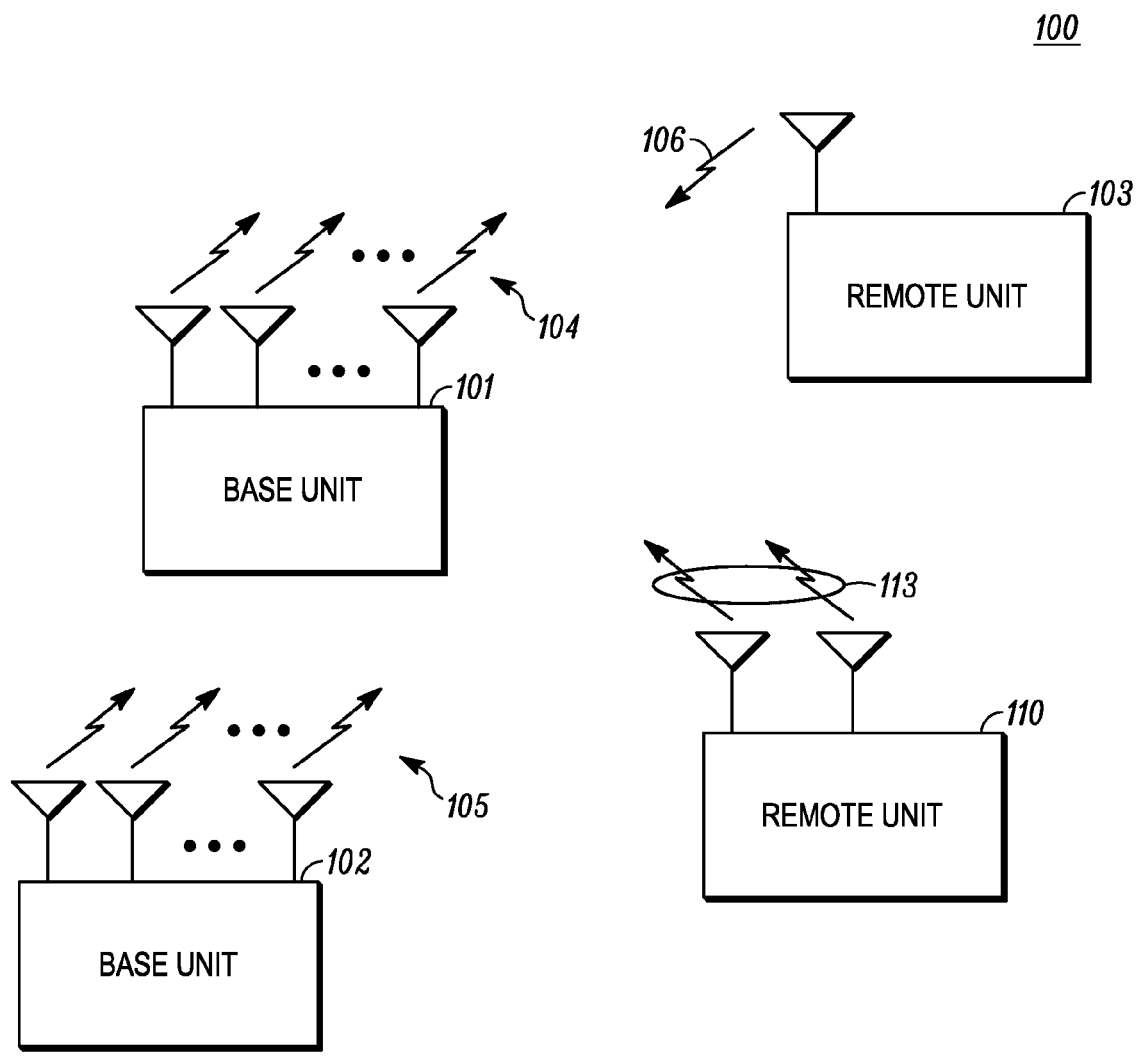
FIG. 1 illustrates a wireless communication system.

In FIG. 1, the wireless communication system 100 includes one or more fixed base infrastructure units forming a network distributed over a geographical region. A base unit may also be referred to as an access point, access terminal, Node-B, eNode-B, or by other terminology used in the art. The one or more base units 101 and 102 serve a number of remote units 103 and 110 within a serving area, for example, a cell, or within a cell sector. The remote units may be fixed units or mobile terminals. The remote units may also be referred to as subscriber units, mobile stations, users, terminals, subscriber stations, user equipment (UE), terminals, or by other terminology used in the art.

Generally, base units 101 and 102 transmit downlink communication signals 104 and 105 to serving remote units in the time and/or frequency domain. Remote units 103 and 110 communicate with one or more base units 101 and 102 via uplink communication signals 106 and 113. The one or more base units may comprise one or more transmitters and one or more receivers that serve the remote units. The remote units may also comprise one or more transmitters and one or more receivers.

In one embodiment, the communication system utilizes OFDMA or a next generation single-carrier (SC) based FDMA architecture for uplink transmissions, such as interleaved FDMA (IFDMA), Localized FDMA (LFDMA), DFT-spread OFDM (DFT-SOFDM) with IFDMA or LFDMA. In OFDM based systems, the radio resources include OFDM symbols, which may be divided into slots, which are groupings of sub-carriers. An exemplary OFDM based protocol is the developing 3GPP LTE protocol.

Figure 2:
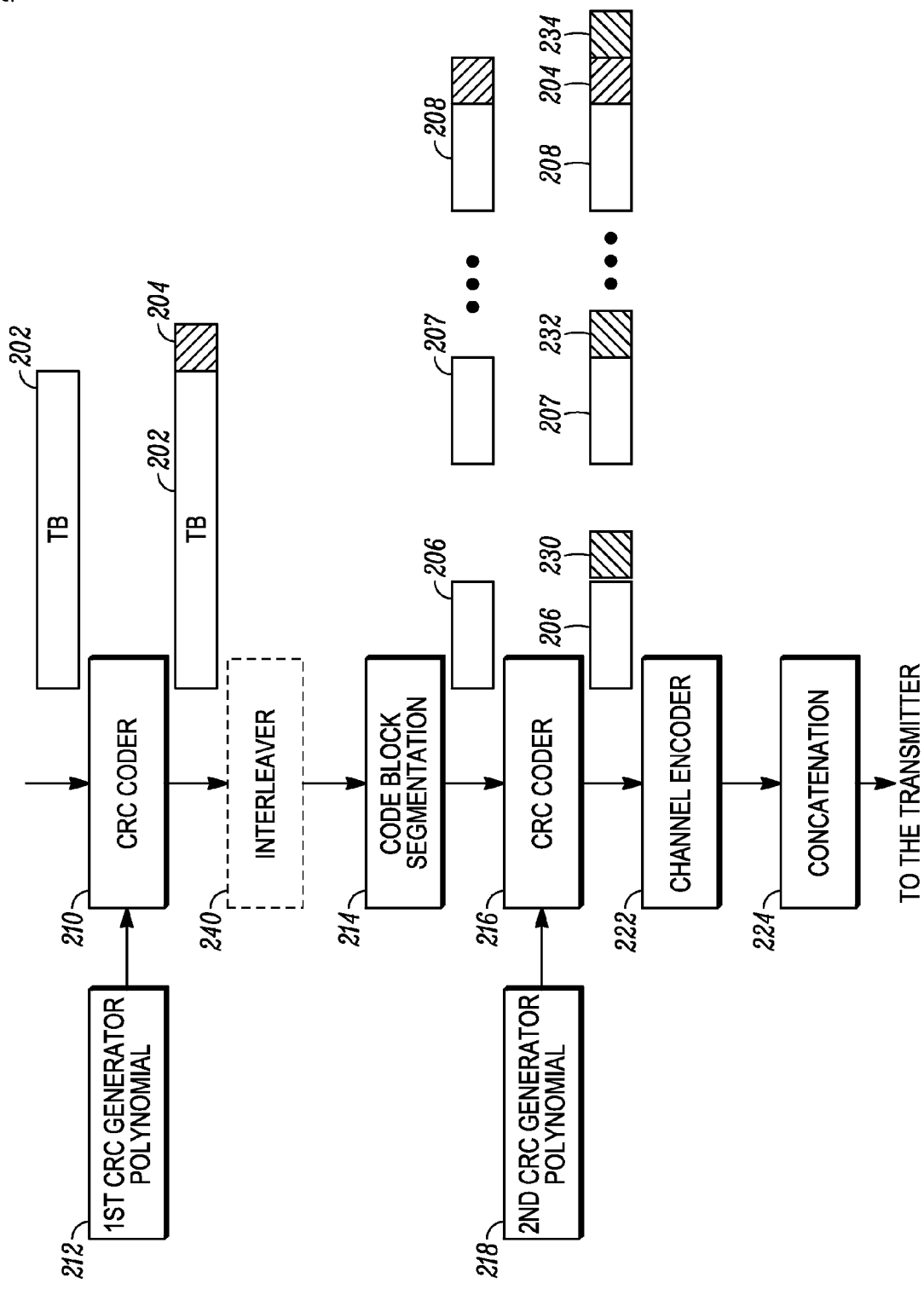
FIG. 2 is a schematic block diagram of a wireless communication device including a transmitter.

Error detection is provided on protocol data units, for example, transport blocks, through a Cyclic Redundancy Check (CRC). FIG. 2 is a wireless communication device 200, or portion thereof, configured to CRC code data for transmission in a wireless communication system. In FIG. 1 such data is transmitted between the base station 101 and the remote unit 103. In 3GPP LTE implementations, the data or protocol data unit is a transport block. CRC coding generally occurs in the transmitter of both the base unit and the remote unit. In FIG. 2, the transmitter includes a first CRC coder entity 210 configured to generate a first block of CRC parity bits on a transport block 202.

The entire transport block is generally used to calculate or generate the CRC parity bits. Denote the bits in a transport block delivered to layer 1 by $a_0, a_1, a_2, a_3, \ldots, a_{A-1}$, and the parity bits by $p_0, p_1, p_2, p_3, \ldots, p_{L-1}$. A is the size of the transport block and L is the number of parity bits. In one 3GPP LTE implementation, the first block includes 24 CRC parity bits, i.e., L set to 24 bits, although more generally, the block may include some other number of parity bits. The parity bits are computed based on a first CRC generator polynomial 212. The first block of CRC parity bits are generally associated with the transport block. In FIG. 2, the first block of CRC parity bits 204 are appended to the transport block 202. In other embodiments, the first block of CRC parity bits are attached to some other portion of the transport block.

In FIG. 2, the wireless communication device 200 also includes a segmentation entity 214. The transport block with the first CRC parity bits attached are delivered to the segmentation entity. The input bit sequence to the code block segmentation is denoted by $b_0, b_1, b_2, b_3, \ldots, b_{B-1}$, where B>0. The segmentation entity segments the transport block 202 having the associated first block of CRC parity bits into a plurality of code blocks 206, 207, 208. A second CRC coder entity 216 is configured to generate a second block of CRC parity bits on each of the plurality of code blocks 206, 207 and 208. Each of the second blocks of CRC parity bits are based on a second generator polynomial 218. In one 3GPP LTE implementation, the second block of CRC parity bits also includes 24 CRC parity bits. Each of the second blocks of CRC parity bits is then associated with the corresponding code block on which the second block of CRC parity bits is based. In FIG. 2, the second blocks of CRC parity bits 230, 232 and 234 are appended to the corresponding code blocks 206, 207 and 208. This process may be implemented serially for each of the segmented code blocks. In some implementations, segmentation is conditional. For example, if B is larger than the maximum code block size, e.g., Z=6144, segmentation of the input bit sequence is performed and an additional CRC sequence of L=24 bits is attached to each code block where the CRC bits are calculated based on a second CRC generator polynomial. If B is smaller than or equal to the maximum code block size, then code block segmentation 214 is transparent, and no second block of CRC parity bits are needed.

The inventors have recognized that the use of the same generator polynomials for the first and second CRC coders 210 and 216 in FIG. 2 leads to error events that remain undetected at one or both levels of CRC checking. If the error event remains undetected at both levels of CRC checking, the receiver will accept an incorrect block as a correct one. Therefore, it is preferable to reduce the error events that may remain undetected at both levels of CRC checking. For a CRC code, an error event that is equal to a non-zero codeword cannot be detected by the CRC decoder. It is also noted that a non-cyclic shifted version of a codeword is still a codeword. Therefore, when the same generator polynomials for the first and second CRC coders are chosen, an undetectable error event in the systematic portion of the code block will remain undetected at both levels of CRC checking and the receiver may accept an incorrect block.

The inventors have recognized further that the error detection capability of the two-level CRC can be improved by using different generator polynomials for CRC encoding the transport block and the segmented code blocks. Thus in some embodiments, the first and second generator polynomials are different. In one embodiment, for example, the first and second generator polynomials have at least one different factor. In another embodiment, the first and second generator polynomials share no common factors. In another embodiment, the first and second generator polynomials have different sets of polynomial coefficients. In other embodiments, the first and second generator polynomials are distinguished by other characteristics. More generally, the first and second polynomials may be distinguished by a combination of these and/or other characteristics. In one embodiment, the first and second generator polynomials share a factor of (D+1) and/or a common degree. In other embodiments, however, the first and second generator polynomials are the same as discussed further below.

In one implementation, the first and second degree generator polynomials are selected from a group comprising the following degree-24 CRC generator polynomials sharing at most a factor of (D+1):

$g_{CRC24,a}(D) = D^{24} + D^{23} + D^6 + D^5 + D + 1.$

This generator polynomial can be factored into the following form:

$(D+1)(D^{23} + D^5 + 1);$ $g_{CRC24,b}(D) = D^{24} + D^{21} + D^{20} + D^{17} + D^{15} + D^{11} + D^9 + D^8 + D^6 + D^5 + D + 1.$

This generator polynomial can be factored into the following form:

$g_{CRC24,b}(D) = (D+1)(D^{23} + D^{22} + D^{21} + D^{19} + D^{18} + D^{17} + D^{14} + D^{13} + D^{12} + D^{11} + D^8 + D^5 + 1);$ $g_{CRC24,c}(D) = D^{24} + D^{23} + D^{18} + D^{17} + D^{14} + D^{11} + D^{10} + D^7 + D^6 + D^5 + D^4 + D^3 + D + 1.$

This generator polynomial can be factored into the following form:

$(D+1)(D^{23} + D^{17} + D^{13} + D^{12} + D^{11} + D^9 + D^8 + D^7 + D^5 + D^3 + 1);$ $g_{CRC24,d}(D) = D^{24} + D^{23} + D^{14} + D^{12} D^8 + 1.$

This generator polynomial can be factored into the following form:

$= (D+1)(D^3 + D^2 + 1)(D^{10} + D^8 + D^7 + D^6 + D^5 + D^4 + D^3 + D + 1)(D^{10} + D^9 + D^6 + D^4 + 1);$ $g_{CRC24,e}(D) = D^{24} + D^{21} + D^{20} + D^{16} + D^{15} + D^{14} + D^{13} + D^{12} + D^{11} + D^{10} + D^9 + D^8 + D^4 + D^3 + 1;$ $g_{CRC24,f}(D) = D^{24} + D^{22} + D^{20} + D^{19} + D^{18} + D^{16} + D^{14} + D^{13} + D^{11} + D^{10} + D^8 + D^7 + D^6 + D^3 + D + 1.$

This generator polynomial can be factored into the following form:

$(D+1)^2(D^{11} + D^9 + D^8 + D^7 + D^6 + D^3 + 1)(D^{11} + D^9 + D^8 + D^7 + D^5 + D^3 + D^2 + D + 1);$ $g_{CRC24,g}(D) = D^{24} + D^{22} + D^{21} + D^{20} + D^{19} + D^{17} + D^{16} + D^8 + D^7 + D^5 + D^4 + D^3 + D^2 + 1.$

This generator polynomial can be factored into the following form:

$(D+1)^2(D^{22} + D^{19} + D^{18} + D^{16} + D^{15} + D^{13} + D^{11} + D^9 + D^7 + D^6 + D^4 + D^3 + 1);$ $g_{CRC24,h}(D) = D^{24} + D^{21} + D^{20} + D^{17} + D^{13} + D^{12} + D^3 + 1.$

This generator polynomial can be factored into the following form:

$(D+1)^2(D^{11} + D^{10} + D^9 + D^8 + D^7 + D^6 + D^5 + D^2 + 1)(D^{11} + D^{10} + D^9 + D^7 + D^6 + D^5 + D^4 + D^3 + 1);$ $g_{CRC24,i}(D) = D^{24} + D^{22} + D^{12} + D^{10} + D^9 + D^2 + D + 1).$

This generator polynomial can be factored into the following form:

$(D+1)^2(D^{11} + D^9 + 1)(D^{11} + D^9 + D^7 + D^5 + D^3 + D + 1);$ and $g_{CRC24,j}(D) = D^{24} + D^{22} + D^{20} + D^{19} + D^{17} + D^{16} + D^{15} + D^{14} + D^{10} + D^7 + D^6 + D^5 + D^4 + D^2 + 1.$ This generator polynomial can be factored into the following form:

$(D^{12} + D^{11} + D^7 + D^4 + D^2 + D + 1)(D^{12} + D^{11} + D^8 + D^7 + D^5 + D^4 + D^2 + D + 1).$

In another implementation, the first and second degree generator polynomials are selected from a group comprising one of the above degree-24 CRC generator polynomials and the reciprocal of one of the above degree-24 CRC generator polynomials. The reciprocal polynomial g(D) of degree n–k is $D^{n-k}g(D^{-1})$. For example, the reciprocal of $g_{CRC24a}(D)$ is $1 + D + D^{18} + D^{19} + D^{23} + D^{24} = (D+1)(D^{23} + D^{18} + 1)$. In a more particular implementation, the first and second degree generator polynomials are selected from the group of $g_{CRC24a}(D)$ and the reciprocal of $g_{CRC24a}(D)$.

In another implementation, the first and second generator polynomials are selected from a group of generator polynomials comprising: $D^{24} + D^{23} + D^6 + D^5 + D + 1$; $D^{24} + D^{21} + D^{20} + D^{17} + D^{15} + D^{11} + D^9 + D^8 + D^6 + D^5 + D + 1$; and $D^{24} + D^{23} + D^{18} + D^{17} + D^{14} + D^{11} + D^{10} + D^7 + D^6 + D^5 + D^4 + D^3 + D + 1$. In another implementation, at least one of the first and second generator polynomials is $D^{24} + D^{23} + D^6 + D^5 + D + 1$.

An L-bit CRC coder may be implemented using polynomial arithmetic as follows. In the CRC calculation, denote the input bits to the CRC computation by $a_0, a_1, a_2, a_3, \ldots, a_{A-1}$ and the parity bits by $p_0, p_1, p_2, p_3, \ldots, p_{L-1}$. A is the size of the input sequence and L is the number of parity bits. The parity bits are generated by a cyclic generator polynomials or CRC generator polynomials ($g_{CRC}(D)$) with L CRC parity bits. The encoding is performed in a systematic form, which means that in GF(2), the polynomial:

$$a_0 D^{A+L-1} + a_1 D^{A+L-2} + \ldots + a_{A-1} D^L + p_0 D^{L-1} + p_1 D^{L-2} + \ldots + p_{L-2} D + p_{L-1}$$

This polynomial yields a remainder equal to 0 when divided by $g_{CRC}(D)$. The bits after CRC attachment are denoted by $b_0, b_1, b_2, b_3, \ldots, b_{B-1}$, where B=A+L. The relation between $a_k$ and $b_k$ is:

$b_k = a_k$ for $k = 0, 1, 2, \ldots, A-1$ $b_k = p_{(L-1-(k-A))}$ for $k = A, A+1, A+2, \ldots, A+L-1$.

In another approach, the relation between $a_k$ and $b_k$ can be follows:

$b_k = a_k$ for $k = 0, 1, 2, \ldots, A-1$ $b_k = p_{(k-A)}$ for $k = A, A+1, A+2, \ldots, A+L-1$.

In FIG. 2, the wireless communication device 200 also includes a channel encoding entity 222 configured to encode each of the code blocks including the associated second block of CRC parity bits. The channel encoding entity may embody any number of different forms including but not limited to a turbo encoder or a convolutional encoder among other channel encoders. The transmitter also includes a concatenating entity 224 configured to concatenate the code blocks after channel encoding. The output of the concatenating entity is coupled to a power amplifier for transmission. The concatenating entity 224 may perform a series of one or more other operations to prepare the code blocks for transmission, for example, rate matching, HARQ redundancy version selection, channel interleaving, bit scrambling, mapping to physical channel resources, bit-to-symbol mapping, IFFT, DFT spreading, etc.

Figure 3:
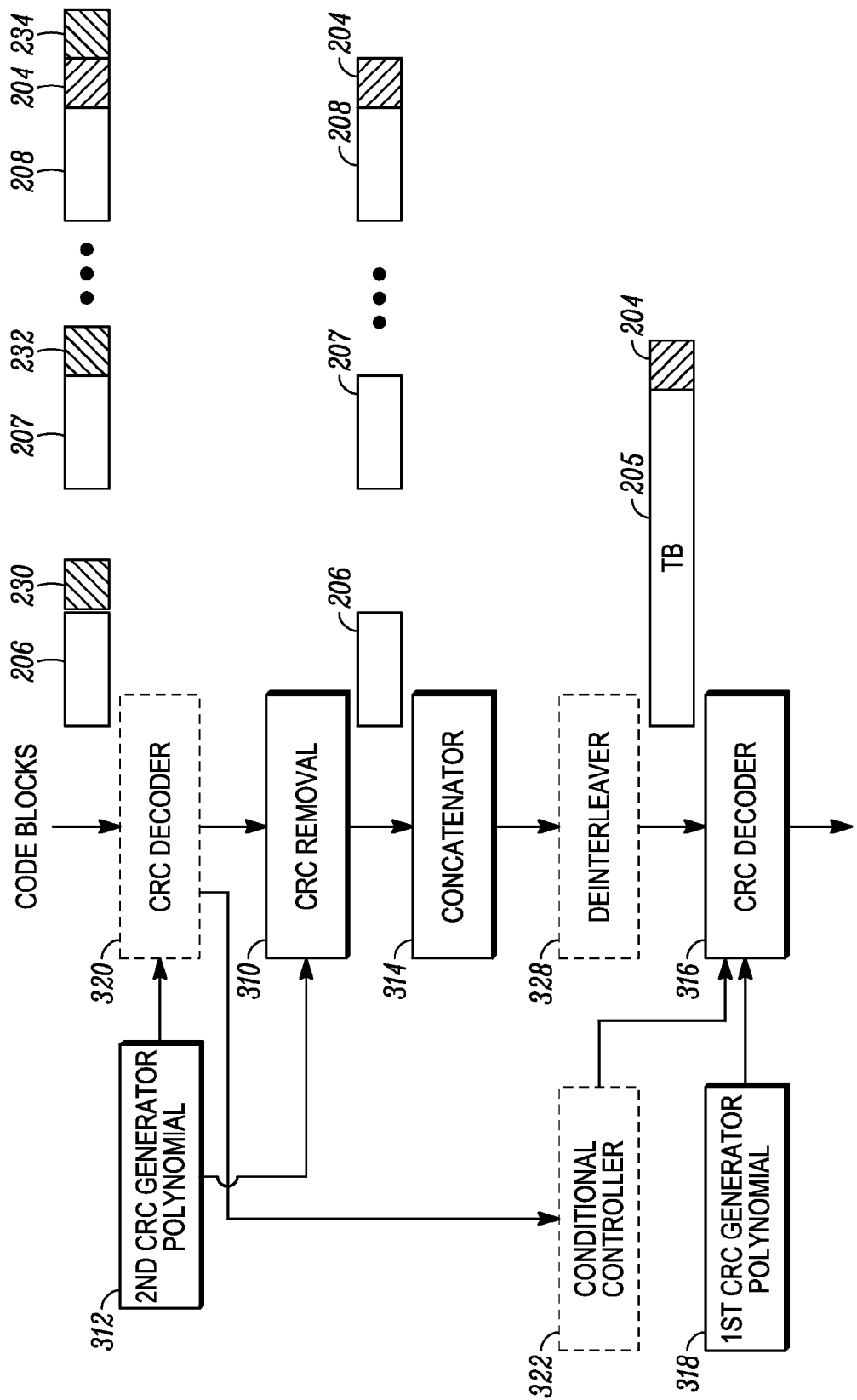
FIG. 3 is a schematic block diagram of a wireless communication device including a receiver.

FIG. 3 is a wireless communication device 300, or portion thereof, configured to receive and decode data encoded with a CRC code. The device 300 receives code blocks 206, 207 and 208 each of which is associated with a corresponding block of CRC parity bits 230, 232, and 234, respectively. These CRC coded code blocks correspond to the code blocks transmitted by the transmitter 200 of FIG. 2. The device 300 includes a CRC removal entity 310 configured to disassociate the second block of CRC parity bits associated with each of a plurality of received code blocks, thus leaving the code block 206, 207 and 208. The removal of the second block of CRC parity bit is based on a second CRC generator polynomial 312. The function performed by the CRC removal entity in FIG. 3 essentially reverses the process performed by the second CRC coder entity 216 in FIG. 2. Thus the second CRC generator polynomial 312 used by the CRC removal entity 310 in FIG. 3 is the same as the second CRC generator polynomial 218 used by the second CRC coder entity 216 to generate and associate the second block of CRC parity bits with the code blocks in FIG. 2.

In FIG. 3, the device 300 includes a concatenator entity 314 configured to form an estimated transport block 205 having a first block of CRC parity bits 204 associated therewith. The concatenator entity 314 concatenates the code blocks 206, 207 and 208 after the associated second block of CRC parity bits are removed by the CRC removal entity 310. The concatenator entity 314 of FIG. 3 essentially reverses the process performed by the segmentation entity 214 of FIG. 2. Thus in FIG. 3 the first block of CRC parity bits 204 corresponds substantially to the first block of CRC parity bits 204 associated with the transport block 202 in FIG. 2.

In FIG. 3, the device 300 includes a CRC decoder entity 316 configured to perform a CRC check on the estimated transport block 202 based on a first generator polynomial 318. As noted, the first generator polynomial 318 in FIG. 3 corresponds to the first generator polynomial 212 in FIG. 2. The CRC check determines whether the estimated transport block 205 recovered by the receiver corresponds to the transmitted transport block, for example, the transport block 202 in FIG. 2. Upon detecting error by the CRC check, the estimated transport block is taken as not corresponding to the transmitted transport block, and a retransmission may be requested. If no errors are detected, the estimated transport block is taken as corresponding to the transmitted transport block and delivered to higher layers. It is known generally that CRC checks have a certain probability of undetected error, which is a measurement of the performance of the CRC code.

In some embodiments, the device 300 includes a second CRC decoder entity 320 configured to perform a CRC check on the plurality of code blocks 206, 207 and 208 received at the receiver. The CRC decoder entity 320 performs a check on the code blocks before the code blocks are concatenated to form the estimated transport block and thus before the performance of the CRC check on the estimated transport block 205. In some embodiments, the first block of CRC parity bits associated with the estimated transport block 205 is based on a first generator polynomial 318 that is different than the second generator polynomial 312 forming the basis of the second block of CRC parity bits associated with the code blocks. In other embodiments, however, the first and second generator polynomials are the same as discussed further below. In some embodiments, the CRC encoding of the code blocks may be used by the receiving device to reduce the number of turbo decoding processes, or to reduce the number of turbo decoding iterations, or to reduce turbo decoder memory usage.

In some embodiments including the second CRC decoder entity 320, the CRC check performed on the estimated transport block 205 is conditional. In one implementation, the CRC check is performed on the estimated transport block 205 only if the CRC checks performed on the plurality of code blocks 206, 207 and 208 do not detect any errors. In FIG. 3, a conditional controller 322 provides a signal that controls whether the CRC decoder 316 performs a CRC check on the estimated transport block 205 based on whether errors have been detected on the code blocks 206, 207 and 208. In some implementations, the code blocks are re-transmitted if errors are detected on the code blocks by the second CRC decoder entity 320. In some implementations, the transport block is retransmitted if errors are detected.

In an alternative embodiment of FIG. 2, the first and second generator polynomials 212 and 218 used to generate the first and second blocks of CRC parity bits share at least one factor. In one implementation, the first and second generator polynomials are the same. In this alternative embodiment, an interleaving operation is perform in the transport block 202 after associating the first block of CRC parity bits. Interleaving is performed by an interleaver entity 240. In one embodiment, the interleaving is performed before segmentation and thus the interleaver entity 240 is located between the first CRC coding entity and the segmentation entity. In an alternative embodiment, the interleaving is performed after segmentation but before CRC encoding of the code blocks. In this alternative embodiment, the interleaving entity 240 is located between the segmentation entity and the second CRC encoding entity 216. The interleaving pattern may be defined in a manner such that interleaving the transport block 202 after associating the first block of CRC parity bits 204 and segmenting the interleaved transport block into multiple code blocks is equivalent to segmenting the transport block 202 into multiple code blocks after associating the first block of CRC parity bits and interleaving the code blocks 206, 207 and 208 individually. This equivalency may be conceptual where interleaving is performed before segmenting. Alternatively, the equivalency may be physical where the interleaver is realized by performing a plurality of sub-interleaving after segmenting. In one implementation, interleaving of the transport block 202 is performed at bit level. In another implementation, interleaving the transport block is performed by permuting groups wherein each group contains a plurality of bits.

In some implementations, the interleaver permutation in FIG. 2 may disallow the same undetectable error event being kept between the first-level CRC check and the second-level. CRC check, thus leading to improved error detection properties. While interleaving is one choice, additional transformations beyond re-ordering (or interleaving) that would disallow the same undetectable error being kept between first-level CRC check and second-level CRC check may also be viable. The interleaving introduced between the transport block and the code blocks may interleave one bit or one byte (or groups of bits of other size) at a time. If the interleaving is performed at the transport block level, one interleaver associated with the transport block after associating the first block of CRC parity bits is needed. Alternatively, the interleaving may be performed at the code block level (i.e., interleaving wherein bits for different segments are not mixed). For code block level interleaving, a total of C sub-interleavers may be needed, where C is the number of message segments. The i-th sub-interleaver is associated with the i-th code block. The interleavers, at the transport block level or the code block level; may be of a simple format such as reversal, i.e.; reading bits from end to front, cyclic shifting, bit-reversal, etc. It is possible that interleaving may require additional latency or circuitry at the receiver though the exact amount can be reduced by choosing the interleavers suitably.

In FIG. 3, in implementations where the first and second generator polynomials are the same and the transport block or code block are interleaved by the transmitting device, the receiving device includes a deinterleaver entity 328. If interleaving occurs on the transport block in the transmitting device, the deinterleaving entity 328 is located after the concatenating entity 314 in the receiver device as illustrated in FIG. 3. If interleaving occurs on the code blocks in the transmitting device, the deinterleaving entity is located before the concatenating entity in the receiver device.

Compared to using the same generator polynomial in the first and the second CRC coder without interleaving, more circuitry and/or memory are generally required to implement using different generator polynomials for the first and the second CRC coders and also to implement interleaving after associating the first block of CRC bits to the transport block. However, the cost associated with the increased complexity is likely outweighed by the enhanced performance of the error detection.

While the present disclosure and the best modes thereof have been described in a manner establishing possession and enabling those of ordinary skill to make and use the same, it will be understood and appreciated that there are equivalents to the exemplary embodiments disclosed herein and that modifications and variations may be made thereto without departing from the scope and spirit of the inventions, which are to be limited not by the exemplary embodiments but by the appended claims.

What is claimed is:

1. A wireless communication device comprising:
a first cyclic redundancy check (CRC) coder configured to generate a first block of CRC parity bits on a transport block, the first block of CRC parity bits based on a first generator polynomial, the first CRC coder attaching the first block of CRC parity bits to the transport block;
a segmenting entity having an input coupled to the first CRC coder, the segmenting entity configured to segment the transport block into multiple code blocks after attaching;
a second CRC coder configured to generate a second block of CRC parity bits on each code block, each of the second block of CRC parity bits based on a second generator polynomial, the second CRC coder attaching a second block of CRC parity bits to each code block, the second block of CRC parity bits attached to each code block is the second block of CRC parity bits generated based on the corresponding code block;
the second generator polynomial is different than the first generator polynomial and the first and second generator polynomials have a common degree;
a channel encoder configured to encode each of the code blocks including the attached second block of CRC parity bits.

2. The device of claim 1, wherein the first and second generator polynomials have at least one different factor.

3. The device of claim 2, wherein the first and second generator polynomials share no factors.

4. The device of claim 2, wherein the first and second generator polynomials share a factor of (D+1).

5. The device of claim 1, the first and second generator polynomials having different sets of polynomial coefficients.

6. The device of claim 1, the first and second generator polynomials selected from a group of generator polynomials comprising:
$D^{24}+D^{23}+D^6+D^5+D+1$;
$D^{24}+D^{21}+D^{20}+D^{17}+D^{15}+D^{11}+D^9+D^8+D^6+D^5+D+1$; and
$D^{24}+D^{23}+D^{18}+D^{17}+D^{14}+D^{11}+D^{10}+D^7+D^6+D^5+D^4+D^3+D+1$.

7. The device of claim 1, wherein the first generator polynomial is $D^{24}+D^{23}+D^{18}+D^{17}+D^{14}+D^{11}+D^{10}+D^7+D^6+D^5+D^4+D^3+D+1$.

8. The device of claim 1, wherein the second generator polynomial is $D^{24}+D^{23}+D^6+D^5+D+1$.

9. A wireless communication device comprising:
a transmitter coupled to a processor,
the processor configured to generate a first block of first cyclic redundancy check (CRC) parity bits on a transport block, the first block of CRC parity bits based on a first generator polynomial;
the processor configured to attach the first block of CRC parity bits to the transport block,
the processor configured to segment the transport block into multiple code blocks after attaching,
the processor configured to generate a second block of CRC parity bits on each code block, each of the second block of CRC parity bits based on a second generator polynomial, the second generator polynomial is different than the first generator polynomial and the first and second generator polynomials have a common degree,
the processor configured to attach a second block of CRC parity bits to each code block, the second block of CRC parity bits attached to each code block is the second block of CRC parity bits generated based on the corresponding code block, the processor configured to channel encode each of the code blocks including the attached second block of CRC parity bits, the processor configured to concatenate the code blocks after channel encoding.

10. The device of claim 9, the first and second generator polynomials selected from a group of generator polynomials comprising:

$D^{24}+D^{23}+D^6+D^5+D+1$;

$D^{24}+D^{21}+D^{20}+D^{17}+D^{15}+D^{11}+D^9+D^8+D^6+D^5+D+1$; and $D^{24}+D^{23}+D^{18}+D^{17}+D^{14}+D^{11}+D^{10}+D^7+D^6+D^5+D^4+D^3+D+1$.

11. The device of claim 9, wherein the first generator polynomial is $D^{24}+D^{23}+D^{18}+D^{17}+D^{14}+D^{11}+D^{10}+D^7+D^6+D^5+D^4+D^3+D+1$.

12. The device of claim 9, wherein the second generator polynomial is $D^{24}+D^{23}+D^6+D^5+D+1$.

13. A wireless communication device comprising:

a receiver coupled to a processor, the processor configured to de-attach a second block of cyclic redundancy check (CRC) parity bits attached to each of a plurality of received code blocks, the second block of CRC parity bits generated based on a second generator polynomial and based on the corresponding code block to which the second block of CRC parity bits are attached;

the processor configured to form an estimated transport block having a first block of CRC parity bits attached to the estimated transport block by concatenating the code blocks after removing the attached second block of CRC parity bits, wherein the first block of CRC parity bits attached to the transport block is based on a first generator polynomial that is different than the second generator polynomial wherein the first and second generator polynomials have a common degree, the processor configured to perform a CRC check on the estimated transport block based on the first generator polynomial.

14. The device of claim 13, the processor configured to perform a CRC on the plurality of code blocks before performing the CRC check on the estimated transport block.

15. The device of claim 14, the processor configured to perform the CRC check on the estimated transport block only if the CRC check on the plurality of code blocks does not detect any errors.

16. The device of claim 12, the first and second generator polynomials selected from a group of generator polynomials comprising:

$D^{24}+D^{23}+D^6+D^5+D+1$;

$D^{24}+D^{21}+D^{20}+D^{17}+D^{15}+D^{11}+D^9+D^8+D^6+D^5+D+1$; and $D^{24}+D^{23}+D^{18}+D^{17}+D^{14}+D^{11}+D^{10}+D^7+D^6+D^5+D^4+D^3+D+1$.

17. The method of claim 12, wherein the first generator polynomial is $D^{24}+D^{23}+D^{18}+D^{17}+D^{14}+D^{11}+D^{10}+D^7+D^6+D^5+D^4+D^3+D+1$.

18. The method of claim 12, wherein the second generator polynomial is $D^{24}+D^{23}+D^6+D^5+D+1$.

19. A wireless communication device comprising:

a first cyclic redundancy check (CRC) coder configured to generate a first block of CRC parity bits on a transport block, the first block of CRC parity bits based on a first generator polynomial, the first CRC coder attaching the first block of CRC parity bits to the transport block;

a segmenting entity having an input coupled to the first CRC coder, the segmenting entity configured to segment the transport block into multiple code blocks after attaching;

a second CRC coder configured to generate a second block of CRC parity bits on each code block, each of the second block of CRC parity bits based on a second generator polynomial, the second CRC coder attaching a second block of CRC parity bits to each code block, the second block of CRC parity bits attached to each code block is the second block of CRC parity bits generated based on the corresponding code block, the first generator polynomial is $D^{24}+D^{23}+D^{18}+D^{17}+D^{14}+D^{11}+D^{10}+D^7+D^6+D^5+D^4+D^3+D+1$ and the second generator polynomial is $D^{24}+D^{23}+D^6+D^5+D+1$; and a channel encoder configured to encode each of the code blocks including the attached second block of CRC parity bits.

* * * * *